United States Patent
Ooneda

(10) Patent No.: US 9,870,836 B2
(45) Date of Patent: Jan. 16, 2018

(54) MEMORY SYSTEM AND METHOD OF CONTROLLING NONVOLATILE MEMORY

(71) Applicant: Toshiba Memory Corporation, Minato-ku (JP)

(72) Inventor: Taku Ooneda, Machida (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 126 days.

(21) Appl. No.: 14/844,263

(22) Filed: Sep. 3, 2015

(65) Prior Publication Data

US 2016/0266826 A1    Sep. 15, 2016

Related U.S. Application Data

(60) Provisional application No. 62/130,939, filed on Mar. 10, 2015.

(51) Int. Cl.
| | | |
|---|---|---|
| *G06F 3/06* | (2006.01) | |
| *G11C 29/50* | (2006.01) | |
| *G11C 29/52* | (2006.01) | |
| *G06F 11/10* | (2006.01) | |
| *G11C 29/00* | (2006.01) | |
| *G11C 11/56* | (2006.01) | |
| *G11C 16/34* | (2006.01) | |
| *G06F 12/02* | (2006.01) | |

(52) U.S. Cl.
CPC ......... *G11C 29/52* (2013.01); *G11C 11/5628* (2013.01); *G11C 16/349* (2013.01); *G11C 29/789* (2013.01); *G06F 12/02* (2013.01); *G11C 2029/5004* (2013.01)

(58) Field of Classification Search
CPC ..................................................... G06F 12/02
See application file for complete search history.

(56) References Cited

U.S. PATENT DOCUMENTS

| 6,854,984 | B1 | 2/2005 | Lee et al. | |
|---|---|---|---|---|
| 8,327,065 | B2 | 12/2012 | Yano et al. | |
| 9,009,436 | B2 * | 4/2015 | Thomas | G06F 12/0207 |
| | | | | 711/103 |
| 2012/0191900 | A1 | 7/2012 | Kunimatsu et al. | |
| 2013/0138870 | A1 | 5/2013 | Yoon et al. | |
| 2014/0281151 | A1 | 9/2014 | Yu et al. | |
| 2015/0170747 | A1 * | 6/2015 | Liu | G11C 16/107 |
| | | | | 365/185.03 |
| 2015/0186270 | A1 * | 7/2015 | Peng | G11C 16/16 |
| | | | | 711/3 |

FOREIGN PATENT DOCUMENTS

| JP | 2011-186555 | 9/2011 |
|---|---|---|
| JP | 2013-114679 | 6/2013 |
| JP | 5317689 | 10/2013 |

* cited by examiner

*Primary Examiner* — Charles Rones
*Assistant Examiner* — Tian-Pong Chang
(74) *Attorney, Agent, or Firm* — Oblon, McClelland, Maier & Neustadt, L.L.P.

(57) ABSTRACT

According to one embodiment, when a command for committing data requested to be written is received from a host, a controller calculates a first value in a case where data has not been written up to a final page of a second block that is a multi-value recording block. The first value represents an amount or a data ratio of data written into the second block. The controller writes write data, which is written into a first block that is a binary-value recording block, up to a final page of the second block in a case where the first value is a first threshold or more.

20 Claims, 6 Drawing Sheets

FIG.7

|  |  | Erace Count(EC) ||
| --- | --- | --- | --- |
|  |  | EC≥K1 | EC<K1 |
| NUMBER OF USABLE BLOCKS OF MLC (NBL) | NBL≥K2 | DECREASE C1 | N/A |
|  | NBL<K2 | N/A | INCREASE C1 |

MEMORY SYSTEM AND METHOD OF CONTROLLING NONVOLATILE MEMORY

CROSS-REFERENCE TO RELATED APPLICATIONS

This application is based upon and claims the benefit of priority from U.S. Provisional Application No. 62/130,939, filed on Mar. 10, 2015; the entire contents of which are incorporated herein by reference.

FIELD

Embodiments described herein relate generally to a memory system including a nonvolatile memory and a method of controlling the nonvolatile memory.

BACKGROUND

As recording modes of a flash memory, there are a multi-value recording (multi-level cell (MLC)) mode and a binary value recording (single-level cell (SLC)) mode. In the SLC mode, one bit is recorded in one memory cell. In the MLC mode, N (here, N≥2) bits can be recorded in one cell.

In a storage system including a flash memory, in a case where writing is finished up to some of pages within a block, in order to improve the reliability of data that has been finished to be written, data is written up to the final page of the block.

BRIEF DESCRIPTION OF THE DRAWINGS

FIG. 7 is a diagram that illustrates a threshold adjustment process.

DETAILED DESCRIPTION

In general, according to one embodiment, a memory system includes a nonvolatile memory and a controller. The nonvolatile memory includes a plurality of blocks. The plurality of blocks includes at least one first block and a plurality of second blocks. The first block includes a plurality of first memory cells. Each of the first memory cells is memory cells on which data of one bit is written. Each of the plurality of second blocks includes a plurality of second memory cells. Each of the second memory cells is memory cells on which data of two bits or more is written. The controller writes first data requested to be written from a host into either the first block or a third block among the plurality of second blocks. The controller calculates a first value in response to a first command transmitted from the host in a case where data is not written up to a final page of the third block. The first command is a command for committing the data requested to be written. The first value represents an amount or a data ratio of data written into the third block. The controller writes the first data written into the first block up to a final page of the third block in a case where the first value is a first threshold or more.

Exemplary embodiments of memory systems and methods of controlling a nonvolatile memory will be explained below in detail with reference to the accompanying drawings. The present invention is not limited to the following embodiments.

First Embodiment

Figure 1:
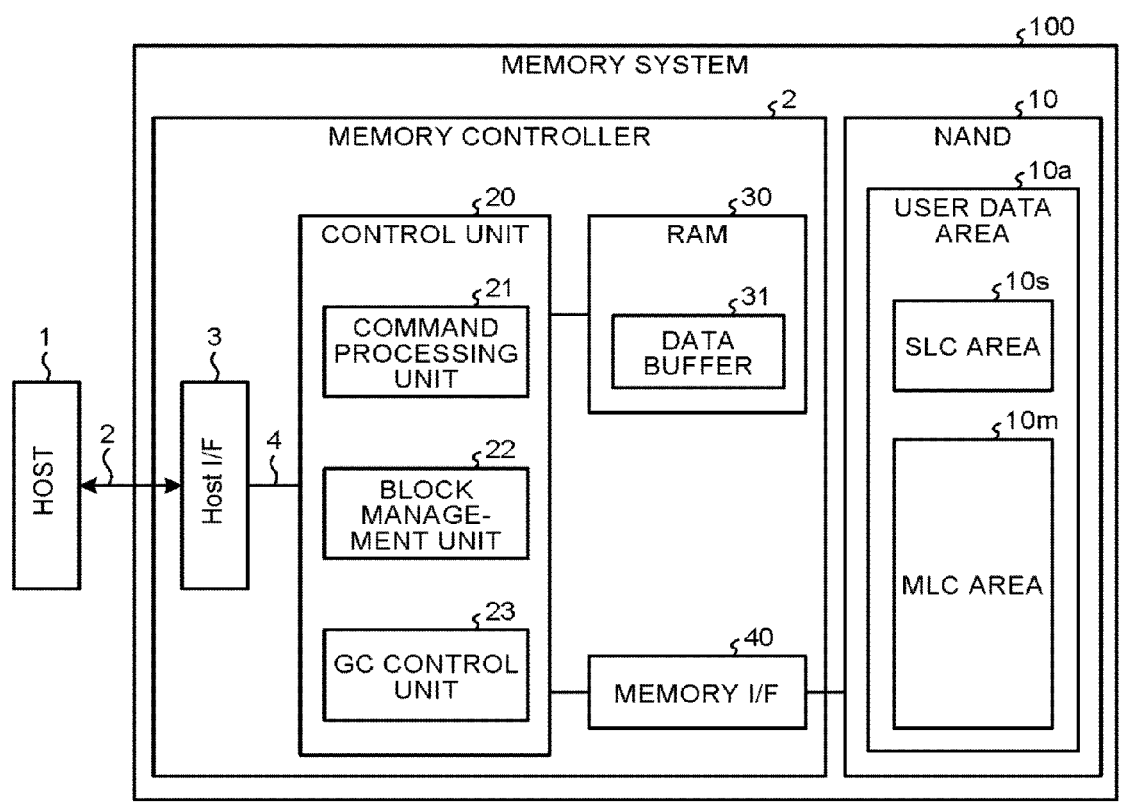
FIG. 1 is a functional block diagram that illustrates the internal configuration of a memory system.

FIG. 1 is a block diagram that illustrates an example of the configuration of a memory system 100 according to a first embodiment. The memory system 100 is connected to a host apparatus (hereinafter, abbreviated as a host) through a communication line 2 and serves as an external storage device of the host 1. The host 1, for example, may be an information processing apparatus such as a personal computer, a mobile phone, or an imaging apparatus, may be a mobile terminal such as a tablet computer or a smart phone, a gaming device, or an in-vehicle terminal such as a car navigation system.

The memory system 100 includes: a NAND flash memory (hereinafter, abbreviated as a NAND) 10 as a nonvolatile memory; and a memory controller 2. The nonvolatile memory is not limited to the NAND flash memory but may be a flash memory having a three-dimensional structure, a resistance random access memory (ReRAM), a ferroelectric random access memory (FeRAM), or the like.

The NAND 10 includes one or more memory chips each including a memory cell array. The memory cell array includes a plurality of memory cells arranged in a matrix pattern. The memory cell array includes a plurality of blocks that are units for data erasing. Each block is configured by a plurality of physical sectors.

Figure 2:
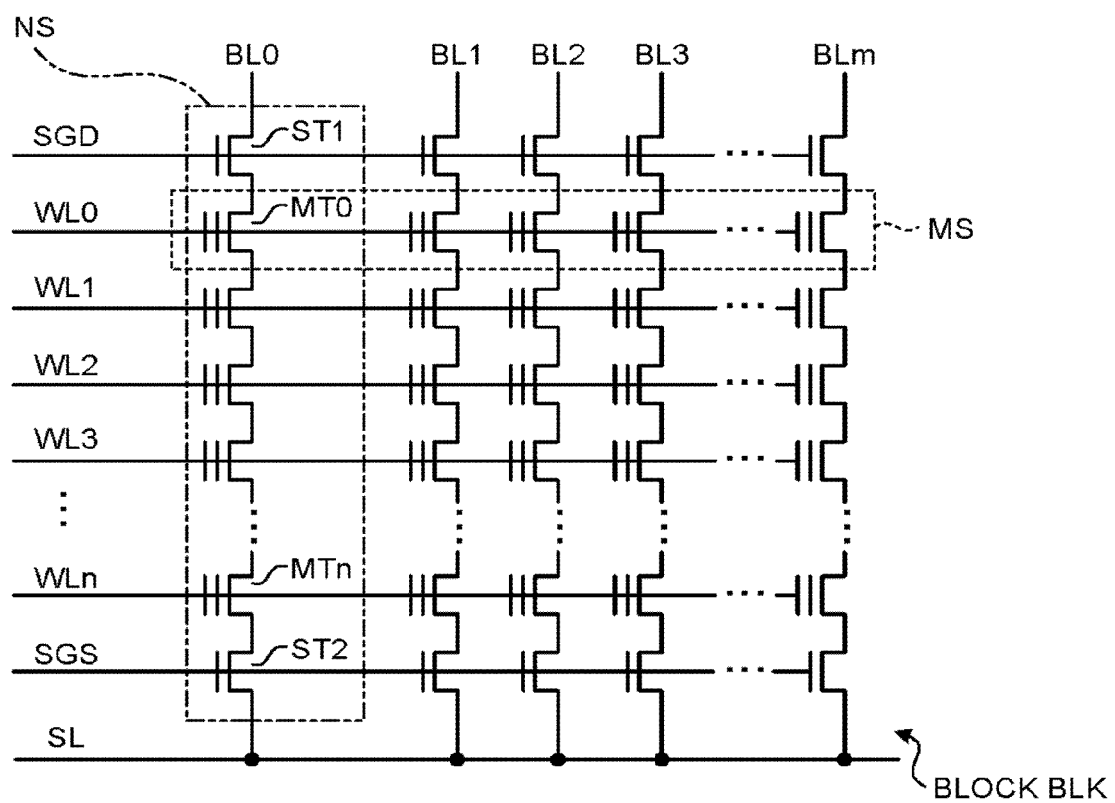
FIG. 2 is a diagram that illustrates an example of the circuit configuration of a memory cell array.

FIG. 2 is a diagram that illustrates an example of the configuration of a block of the memory cell array. FIG. 2 illustrates one of a plurality of blocks that configure the memory cell array. The other blocks of the memory cell array have the same configuration as that illustrated in FIG. 2. As illustrated in FIG. 2, the block BLK of the memory cell array includes (m+1) (here, m is an integer of zero or more) NAND strings NS. Each NAND string NS shares a diffusion region (a source region or a drain region) between memory cell transistors MT adjacent to each other. Each NAND string NS includes: (n+1) (here, n is an integer of zero or more) memory cell transistors MT0 to MTn connected in series; and selection transistors ST1 and ST2 arranged at both ends of the column of the (n+1) memory cell transistors MT0 to MTn.

Word lines WL0 to WLn are respectively connected to control gate electrodes of the memory cell transistors MT0 to MTn that configure the NAND string NS, and, memory cell transistors MTi (here, i=0 to n) included in each NAND string NS are connected to be common using the same word line WLi (here, i=0 to n). In other words, the control gate electrodes of the memory cell transistors MTi disposed in the same row within the block BLK are connected to the same word line WLi.

Each of the memory cell transistors MT0 to MTn is configured by a field effect transistor having a stacked gate structure on a semiconductor substrate. Here, the stacked gate structure includes: a charge storage layer (floating gate electrode) formed on the semiconductor substrate with a gate insulating film being interposed therebetween; and a control gate electrode formed on the charge storage layer with an inter-gate insulating film being interposed therebetween. A threshold voltage of each of the memory cell transistors MT0 to MTn changes according to the number of electrons storable in the floating gate electrode and thus, can store data according to a difference in the threshold voltage.

Bit lines BL0 to BLm are respectively connected to the drains of (m+1) selection transistors ST1 within one block BLK, and a selection gate line SGD is connected to be common to the gates of the selection transistors. In addition, the source of the selection transistor ST1 is connected to the drain of the memory cell transistor MT0. Similarly, a source line SL is connected to be common to the sources of the (m+1) selection transistors ST2 within one block BLK, and a selection gate line SGS is connected to be common to the gates of the selection transistors. In addition, the drain of the selection transistor ST2 is connected to the source of the memory cell transistor MTn.

Each memory cell is connected to the word line and connected to the bit line as well. Each memory cell can be identified by using an address identifying a word line and an address identifying a bit line. As described above, the data of the plurality of memory cells (the memory cell transistors MT) disposed within the same block BLK is erased altogether. On the other hand, data is written and read in units of physical sectors MS. One physical sector MS includes a plurality of memory cells connected to one word line.

Each memory cell can perform multi-value storage. In a case where the memory cells are operated in a single level cell (SLC) mode, one physical sector MS corresponds to one page. On the other hand, in a case where the memory cells are operated in a multiple level cell (MLC) mode, one physical sector MS corresponds to N pages (here, N is a natural number of two or more). In descriptions presented here, the term MLC mode is assumed to include a triple level cell (TLC) mode of N=3. In a case where N=2, one physical sector MS corresponds to two pages (a lower page and an upper page), and, in a case where N=3, one physical sector corresponds to three pages (a lower page, a middle page, and an upper page).

In a read operation and a program operation, one word line is selected and one physical sector MS is selected according to the physical address. A page switching within this physical sector MS is performed using the physical address.

User data transmitted from the host 1 and management information and firmware of the memory system 100 are stored in the NAND 10. The firmware operates a CPU (not illustrated in the figure) realizing at least some of the functions of a control unit 20 of the memory controller 2. The firmware described above may be stored in a ROM not illustrated in the figure. The management information described above includes a logical/physical translation table, a block management table, and the like.

A user data area 10a in which the user data is stored includes an SLC area 10s and an MLC area 10m. The SLC area 10s includes one or a plurality of SLC blocks. The SLC block is a block that is operated in the SLC mode. The MLC area 10m includes a plurality of MLC blocks. The MLC block is a block that is operated in the MLC mode. The SLC area 10s serves as a data buffer disposed inside the NAND 10. In a case where there is a vacant space of data in the SLC area 10s, write data directed according to a write request from the host 1 is stored in the SLC area 10s. On the other hand, in a case where the SLC area 10s is filled with data, the write data is stored in the MLC area 10m.

The memory controller 2 includes: a host interface 3; a memory interface 40; a RAM 30; and a control unit 20. In this embodiment, while the RAM 30 is arranged inside the memory controller 2, the RAM 30 may be disposed outside the memory controller 2. The host I/F 3 outputs a command, user data (write data), and the like received from the host 1 to an internal bus 4. In addition, the host I/F 3 transmits user data read from the NAND 10, a response from the control unit 20, and the like to the host 1. As the host I/F 3, serial advanced technology attachment (SATA), PCI express (PCIe), serial attached SCSI (SAS), or the like is used. The memory I/F 40 directly controls the NAND 10 based on an instruction from the control unit 20.

The RAM 30 is a volatile semiconductor memory that can be accessed at a speed higher than that of the NAND 10. The RAM 30 includes a storage area as a data buffer 31. The data buffer 31 temporarily stores data received from the host 1 before writing the data into the NAND 10 or temporarily stores data read from the NAND 10 before transmitting the data to the host 1. The management information stored in the NAND 10 is loaded into the RAM 30. The management information loaded into the RAM 30 is backed up in the NAND 10. The RAM 30 serves also as a buffer in which firmware stored in the NAND 10 is loaded. A static random access memory (SRAM) or a dynamic random access memory (DRAM) is used as the RAM 30.

The control unit 20 includes: a command processing unit 21; a block management unit 22, a garbage collection (GC) control unit 23. The function of the control unit 20 is realized by one or a plurality of CPUs (processors) executing the firmware loaded in the RAM 20 and peripheral circuits thereof. The function of the command processing unit 21 is realized by the CPU executing the firmware and/or hardware. The function of the block management unit 22 is realized by the CPU executing the firmware and/or hardware. The function of the garbage collection (GC) control unit 23 is realized by the CPU executing the firmware and/or hardware.

The command processing unit 21 performs a process according to a command received from the host 1. For example, in a case where a write request is received from the host 1, the command processing unit 21 temporarily stores write data in the data buffer 31. The command processing unit 21, for example, when the data buffer 31 is full, reads data stored in the data buffer and writes the read data in a user data area 10a of the NAND 10 through the memory I/F 40. When data is to be written into the user data area 10a, as described above, in a case where any one of SLC blocks included in the SLC area 10s is not filled with data, the write data is stored in the SLC area 10s. On the other hand, in a case where all the SLC blocks included in the SLC area 10s are filled with data, the write data is stored in the MLC area 10m. Here, the block being filled with data means that there is no vacant page on which data can be written into a block.

In addition, when a read request is received from the host 1, the command processing unit 21 instructs the memory I/F 40 to read data from the NAND 10. The memory I/F 40 temporarily stores the data read from the NAND 10 in the data buffer 31. The command processing unit 21 transmits the read data stored in the data buffer 31 to the host 1 through the host I/F 3.

The command processing unit 21 manages the user data by using the logical/physical translation table that is one item of the above-described management information loaded in the RAM 30. In the logical/physical translation table, mapping associating a logical address used by the host 1 and a physical address of the RAM 30 or the NAND 10 with each other is registered. For the logical address, for example, logical block addressing (LBA) is used. The physical address represents a storage position on the RAM 20 or the NAND 10 in which data is stored.

The block management unit 22 manages blocks included in the NAND 10 by using the block management table that is one item of the above-described management information loaded in the RAM 30. In the block management table, for example, the following block management information is managed.
(a) Number of times of erasing executed in units of blocks
(b) Information used for identifying whether a block is either an active block or a free block
(c) Information used for identifying whether a block is either an SLC block or an MLC block
(d) Number of SLC blocks
(e) Number of MLC blocks
(f) Block addresses of bad blocks An active block is a block in which valid data is recorded. A free block is a block that has no valid data being recorded therein and can be reused by erasing data. The valid data is data that is associated with a logical address, and invalid data is data that is not associated with a logical address. When data is written into a free block after erasing data, the free block becomes an active block. A bad block is an unusable block that does not normally operate due to various factors.

The GC control unit 23 controls a garbage collection process. In the memory system 100, in a case where the unit (block) for data erasing and the unit for data reading/writing is different from each other, when rewriting data into the NAND 10 progresses, the block is fragmented due to invalid data. As the number of such fragmented blocks increases, the number of usable blocks decreases. Thus, for example, in a case where the number of free blocks of the NAND 10 is less than a predetermined threshold, a garbage collection process is performed in which valid data is moved by collecting valid data of blocks (GC source blocks) in which invalid data is included and rewriting the collected valid data into block (GC destination block) of which data is newly erased, whereby the number of free blocks is increased.

For example, before power of the memory system 100 is cut off, the host 1 transmits a flush command to the memory system 100. The flush command, for example, is an E7h Flush CACHE command or an EAh Flush CACHE EXT command that is compliant with the serial ATA (SATA) standard. The flush command is used for requesting the commitment of the write data transmitted from the host 1 before the flush command. The flush command, for example, is a request command for nonvolatilization of data stored in a volatile memory. When the flush command is received, the memory system 100 causes data to be nonvolatile by storing the data, which is temporarily stored in the volatile buffer memory, into the NAND 10, thereby avoiding a loss of the write data.

Meanwhile, in the memory system 100 including a flash memory such as the NAND 10, in a state in which data is finished to be written into some pages within a block, in order to prevent power cutoff when the remaining pages within the block are in the erased state, a padding process is performed in which data of the first page among the remaining pages within the block to the final page within the block is written before the cutoff of power. In order to improve the reliability of data, this padding process is performed for the MLC block but is not performed for the SLC block.

Data stored within an SLC block included in the SLC area 10s that is arranged within the NAND 10 is used for the padding process described above. In other words, in the memory system 100, in a case where a flush command is received in a state in which data is written up to some pages in an MLC block, a padding process for writing data into the MLC block up to the final page by using the data stored in the SLC block is performed.

For the padding process, it is requested that data is constantly stored in the SLC block. Accordingly, as described above, in a case where the vacant page described above is present in the SLC area 10s, first, the write data is written into the SLC area 10s. For this reason, data is rewritten into the SLC block at a high frequency, and the SLC block wears more than the MLC block. In a case where the SLC block wears and becomes a bad block, in order to secure the number of SLC blocks, the block management unit 22 uses some of MLC blocks as SLC blocks. When such a status progresses, and the MLC blocks corresponding to the user capacity cannot be secured, the memory system 100 proceeds to a malfunction mode. As above, in a case where only the SLC blocks are used for the padding process, there is a possibility that the life of the memory system 100 is shortened.

Thus, in this embodiment, for the padding process, data stored within an SLC block, data stored within a data moving target block of the garbage collection process or the like, and dummy data are used. The dummy data is invalid data other than the write data transmitted from the host 1 and, for example, may be arbitrary data such as FF . . . FFh.

Figure 3:
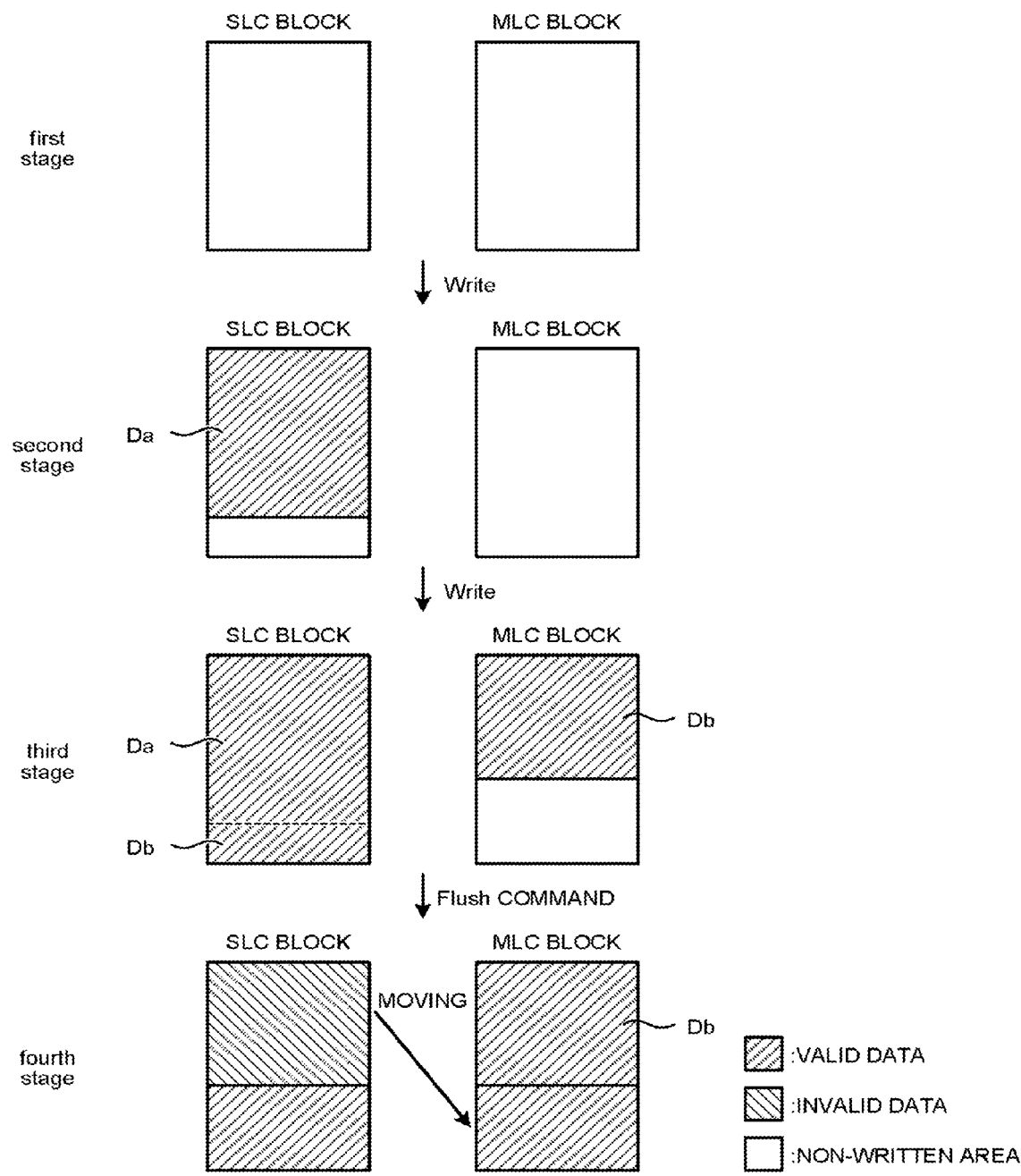
FIG. 3 is a conceptual diagram that illustrates an example of a write operation for an SLC block and an MLC block and an example of data padding using an SLC block.

FIG. 3 is a diagram that illustrates a writing process of write data for the NAND 10 and a padding process performed when a flush command is received. In FIG. 3, a white space within an SLC block or an MLC block represents an area in which data has not been written. In addition, hatching drawn downward to the left represents an area in which valid data is written, and hatching drawn downward to the right represents an area in which invalid data is written.

As illustrated in a first stage represented in FIG. 3, initially, the SLC block and the MLC block are in a free block state in which data has been erased. When a write command is received, the write data is buffered in the data buffer 31 of the RAM 30. The memory capacity of the data buffer 31 is much smaller than that of the MLC block and is not mainly used for the padding process of the MLC block. In this case, since data has not been written in the SLC block, the data Da buffered in the data buffer 31, as illustrated in a second stage represented in FIG. 3, first, is stored in the SLC block. As illustrated in a third stage represented in FIG. 3, in a case where write data Db is further written, first, data is written into the SLC block, and, in a case where data is written into the SLC block up to the final page, next, data is written into the MLC block. In a case where a flush command is received before data is written into the final page of the MLC block, as illustrated in a fourth stage represented in FIG. 3, a padding process for writing data into the MLC block up to the final page by moving the data stored in the SLC block to the MLC block is performed. The logical/physical translation table described above is updated as follows according to the movement of the data. In the SLC block, a logical address associated with a physical address at which the data of a movement source is stored is invalidated. In addition, in the MLC block, a logical address associated with a physical address at which the data of the movement destination is stored is validated.

Figure 4:
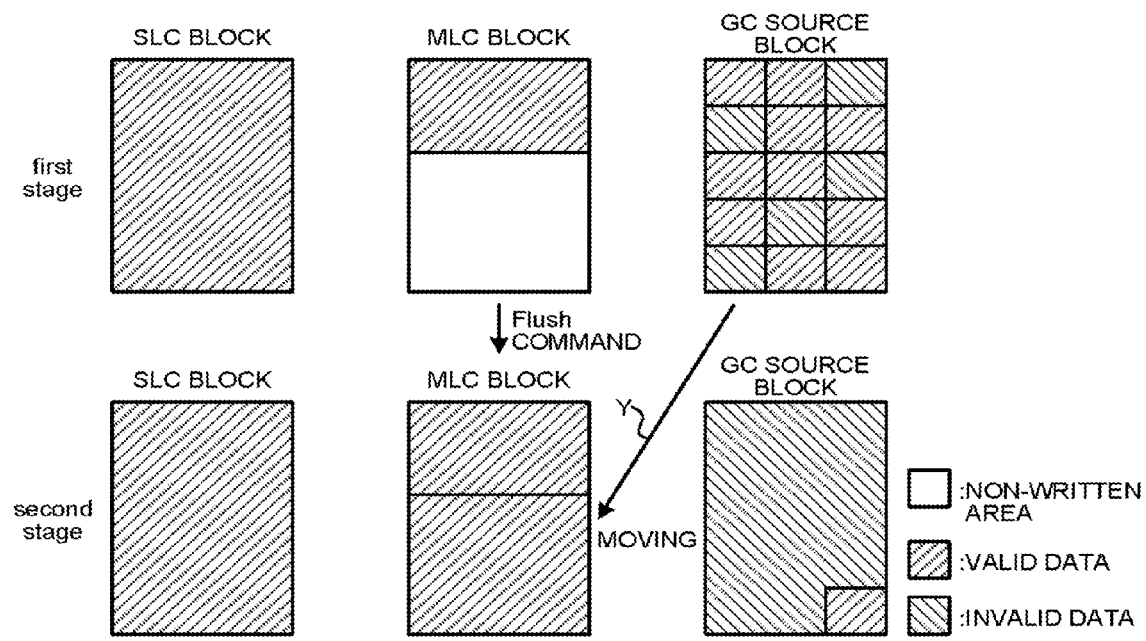
FIG. 4 is a conceptual diagram that illustrates an example of data padding using a GC target block.

FIG. 4 is a diagram that illustrates a padding process using valid data stored within a GC source block. In FIG. 4, a white space represented within an SLC block or an MLC block illustrates an area in which data has not been written.

In addition, hatching drawn downward to the left represents an area in which valid data is written, and hatching drawn downward to the right represents an area in which invalid data is written.

As illustrated in FIG. 4, data is written up to the final page in the SLC block. In addition, as illustrated in a first stage represented in FIG. 4, at first, data has not been written up to the final page in the MLC block. As illustrated in the first stage represented in FIG. 4, at first, in the GC source block, pages on which valid data is stored and pages in which invalid data is stored are mixed. In this state, in a case where a flush command is received, as denoted by an arrow Y, the padding process is performed by moving the valid data stored within the GC source block to the MLC block. As a result, as illustrated in a second stage represented in FIG. 4, data is written up to the final page in the MLC block. In addition, as illustrated in the second stage represented in FIG. 4, the moved data stored within the GC source block becomes invalid data. The logical/physical translation table is updated as follows according to the movement of the data. In the GC source block, a logical address associated with a physical address at which the data of the movement source is stored is invalidated. In addition, in the MLC block, a logical address associated with a physical address at which the data of the movement destination is stored is validated. Here, it is preferable that the GC source block used for the padding process is selected from among MLC blocks.

Figure 5:
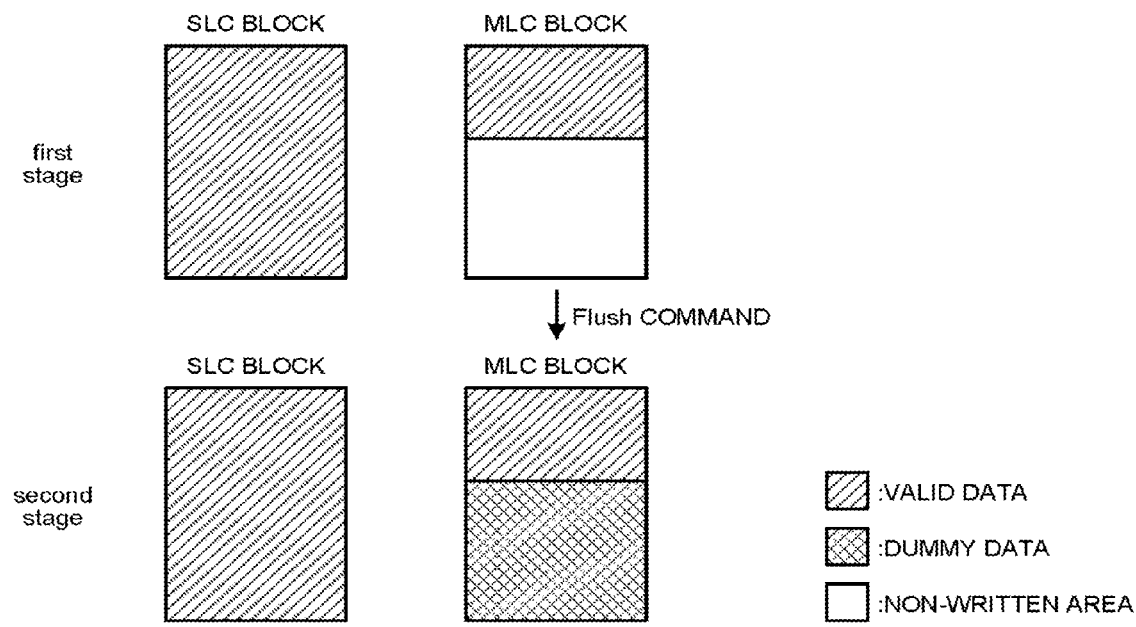
FIG. 5 is a conceptual diagram that illustrates an example of data padding using dummy data.

FIG. 5 is a diagram that illustrates a padding process using dummy data. In FIG. 5, a white space represented within an SLC block or an MLC block illustrates an area in which data has not been written. In addition, hatching drawn downward to the left represents an area in which valid data is written, and hatching drawn downward to the right represents an area in which invalid data is written. Furthermore, cross-hatching represents an area in which dummy data is written.

As illustrated in FIG. 5, data is written up to the final page in the SLC block. In addition, as illustrated in a first stage represented in FIG. 5, at first, data has not been written up to the final page in the MLC block. In this state, in a case where a flush command is received, as illustrated in a second stage represented in FIG. 5, the padding process is performed by writing the dummy data into the MLC block. As a result, data is written up to the final page in the MLC block. The logical/physical translation table is updated as follows according to the writing of the dummy data. In the MLC block, a logical address associated with a physical address at which the dummy data has been written is invalidated, and, in the entry thereof, information representing that the dummy data has written is recorded.

Figure 6:
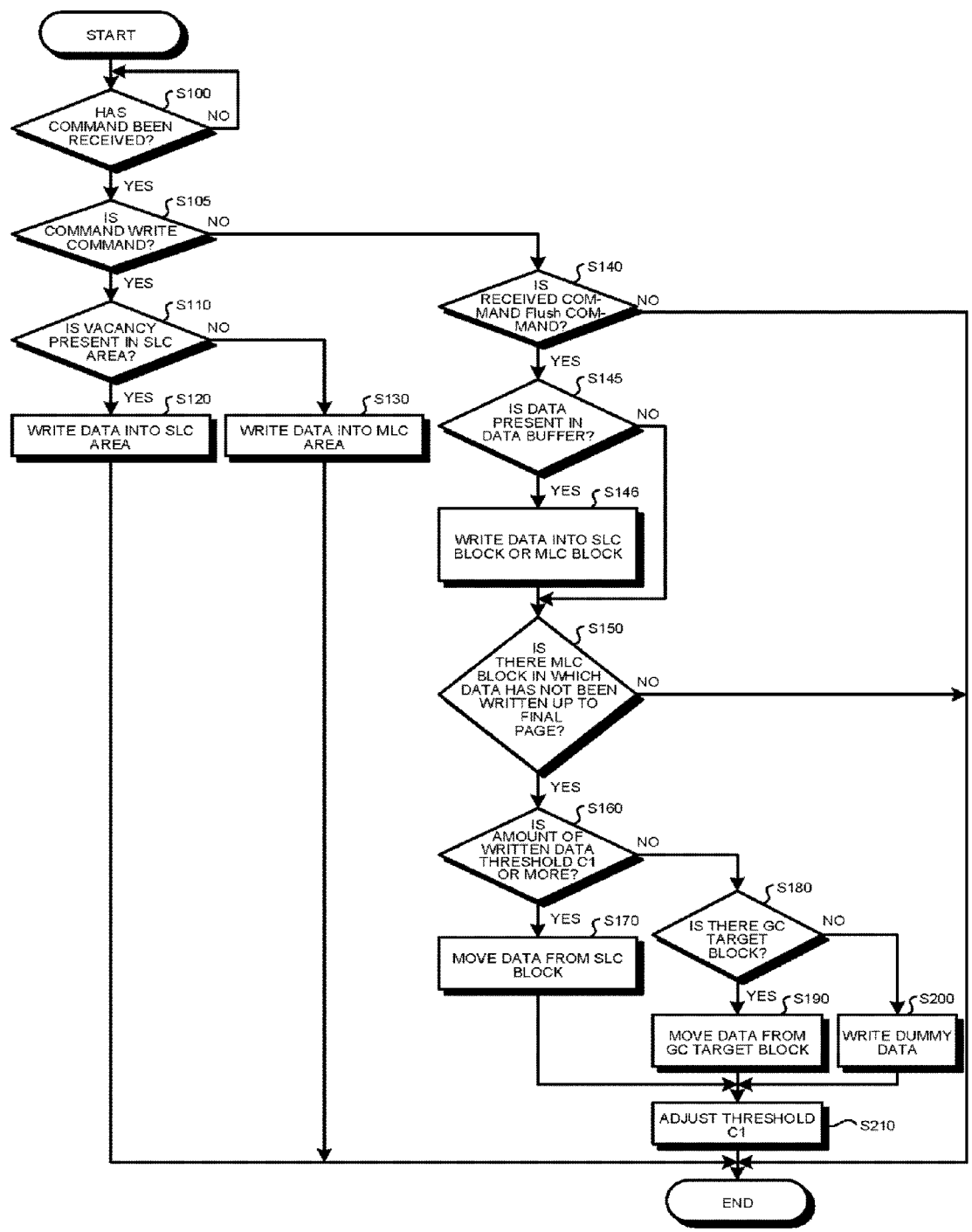
FIG. 6 is a flowchart that illustrates an example of operations of the memory system when a write command and a flush command are received.

FIG. 6 is a flowchart that illustrates an example of the operation performed when the memory system 100 receives a write command and a flush command from the host 1. The command processing unit 21 determines whether or not a command has been received from the host 1 (Step S100). When the command is received (Step S100: Yes), the command processing unit 21 determines whether or not the received command is a write command (Step S105). In a case where the received command is a write command (Step S105: Yes), the command processing unit 21 determines whether or not there is an SLC block having a non-written area in the SLC area 10s (Step S110). In a case where a result of the determination of Step S110 is "Yes", the command processing unit 21 writes write data in the SLC block arranged inside the SLC area 10s through the data buffer 31 (Step S120). On the other hand, in a case where there is no SLC block having a non-written area in the SLC area 10s (Step S110: No), the command processing unit 21 writes the write data into the MLC area 10m through the data buffer 31 (Step S130).

When a flush command is received from the host 1 (Step S140: Yes), the command processing unit 21 performs the following process. Here, an operation performed when a command other than the write command and the flush command is received will not be described. The command processing unit 21 determines whether or not write data is stored in the data buffer 31 of the RAM 30 (Step S145). In a case where the write data is stored in the data buffer 31 (Step S145: Yes), the command processing unit 21 reads the write data stored in the data buffer 31 and writes the read write data into the SLC area 10s or the MLC area 10m (Step S146). In Step S146, a process similar to the process of Steps S110 to S130 is performed. In other words, in a case where there is an SLC block having a non-written area in the SLC area 10s, the write data stored within the data buffer 31 is read out and is written into the SLC area 10s. On the other hand, in a case where there is no SLC block having a non-written area in the SLC area 10s, the write data stored within the data buffer 31 is read out and is written into the MLC area 10m. In addition, in a case where a result of the determination made in Step S145 is "No", the command processing unit 21 causes the process to proceed to Step S150.

The command processing unit 21 determines whether or not there is an MLC block in which data has not been written up to the final page (Step S150). In a case where a result of the determination is "No", the command processing unit 21 ends the process. On the other hand, in a case where a result of the determination made in Step S150 is "Yes", the command processing unit 21 determines whether or not the amount of data written into the MLC block is a threshold C1 or more (Step S160).

In a case where the amount of data written into the MLC block is the threshold C1 or more, the command processing unit 21, as illustrated in FIG. 3, selects data stored in the SLC block as data used for the padding process and moves the data stored in the SLC block to the MLC block (Step S170).

On the other hand, in a case where the amount of data written into the MLC block is not the threshold C1 or more, the command processing unit 21 inquires the GC control unit 23 whether there is a candidate for the GC source block (Step S180). In a case where there is a candidate for the GC source block (Step S180: Yes), the command processing unit 21, as illustrated in FIG. 4, selects valid data stored within the GC source block as the data used for the padding process and moves the valid data stored within the GC source block to the MLC block (Step S190).

In a case where there is no candidate for the GC source block (Step S180: No), the command processing unit 21, as illustrated in FIG. 5, selects the dummy data as the data used for the padding process and writes the dummy data into the non-written area of the MLC block (Step S200).

When the process of Step S170, S190, or S200 ends, the process proceeds to Step S210. In Step S210, a process of adjusting the threshold C1 is performed. The adjustment of the threshold C1 is performed by using the number of usable MLC blocks (NBL) and an average number of times of erasing data of the MLC blocks. The usable MLC blocks are blocks acquired by excluding bad blocks from all the MLC blocks in the MLC area 10m. Hereinafter, the average number of times of erasing data of the MLC blocks will be abbreviated as an erase count (EC). The block management unit 22 manages the number NBL and the EC.

FIG. 7 illustrates an example of the relation between the number NBL and the EC and the adjustment of the threshold C1. In FIG. 7, N/A represents "not available". In the example illustrated in FIG. 7, in a case where the number NBL is a threshold K2 or more, and the EC is a threshold K1 or more, it is determined that the MLC block in the MLC area 10*m* is determined to wear more than the SLC block in the SLC area 10*s*, and the threshold C1 is decreased. Accordingly, the amount of movement of data from the SLC block to the MLC block for the padding process increases, and, as a result, the frequency at which the SLC block is used for the padding process increases. To the contrary, in a case where the number NBL is less than a threshold K2, and the EC is less than the threshold K1, the SLC block side is determined to wear more than the MLC block, and the threshold C1 is increased. Accordingly, the amount of movement of data from the SLC block to the MLC block for the padding process decreases, and, as a result, the frequency at which the SLC block is used for the padding process decreases. Here, the number of thresholds K1 and K2 is merely an example, and an arbitrary number of thresholds may be used.

In this way, the command processing unit 21 adjusts the threshold C1 using the number NBL and the EC (Step S210). Thereafter, a process similar thereto is repeated.

As above, in the first embodiment, according to the amount of data written into the MLC block, data used for the padding process is configured to be selected from among the data stored within the SLC block, the data stored within the garbage collection target block, and the dummy data. Accordingly, in the first embodiment, compared to a case where only the SLC block is used for the padding process, the life of the memory system 100 can be lengthened.

In addition, in the first embodiment, the threshold used for selecting data that is used for the padding process is adjusted by using the number of usable MLC blocks (NBL) and the average erase count of the MLC blocks. For this reason, the use frequencies of the SLC blocks and the MLC blocks are leveled, and the life of the memory system 100 can be further lengthened.

Furthermore, in the embodiment described above, while the GC source block is used for the data used for the padding process, a block other than the GC source block may be used as long as the block includes the moving target data. For example, a data movement source block used for wear leveling may be used for the padding process.

In addition, in Step S160 represented in FIG. 6, while the data used for the padding process is selected by comparing the amount of data written into the MLC block with the threshold C1, the data used for the padding process may be selected by comparing a write ratio for the MLC block with a threshold C2. Here, the write ratio is a value acquired by dividing the amount of data written into the MLC block by the entire capacity of the MLC blocks.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a nonvolatile memory including at least one first block and a plurality of second blocks, and
    a controller configured to
        write first data received from a host into the first block in a single level cell mode,
        write second data received from the host into a third block in a multiple level cell mode, the third block being a block among the second blocks,
        calculate a first value in response to a first command being a command for committing the first data and the second data, the first value representing an amount of the second data that has been written in the third block or a ratio between the second data that has been written in the third block and an entire capacity of the third block, and
        move, into the third block until the third block becomes full, the first data that has been written in the first block in case where the first value is more than a first threshold.

2. The memory system according to claim 1, wherein, in case where the first value is less than the first threshold, the controller writes, into the third block until the third block becomes full, dummy data or valid data stored in a fourth block, the fourth block being a Garbage Collection source block among the first block and the second blocks.

3. The memory system according to claim 2, wherein
    the fourth block includes the valid data and invalid data, and
    the controller is configured to:
        write the valid data into the third block in case where the fourth block is present; and
        write the dummy data into the third block in case where the fourth block is not present.

4. The memory system according to claim 1, wherein
    the controller is configured to write the first data into the first block in case where the first block is not full, and write the second data into the third block in case where the first block is full.

5. The memory system according to claim 3, wherein the controller is configured to use a free block among the plurality of second blocks as the first block in case where the first block becomes a bad block.

6. The memory system according to claim 5, wherein the controller changes the first threshold based on a number of the plurality of second blocks and a number of times of erasing data of the plurality of second blocks.

7. The memory system according to claim 6, wherein the controller decreases the first threshold in case where the number of the plurality of second blocks is more than a second threshold, and the number of times of erasing data is more than a third threshold.

8. The memory system according to claim 7, wherein the controller increases the first threshold in case where the number of the plurality of second blocks is less than the second threshold, and the number of times of erasing data is less than the third threshold.

9. The memory system according to claim 3, wherein the fourth block is a block among the plurality of second blocks.

10. The memory system according to claim 1, further comprising a volatile memory, wherein the first command is a flush cache command that is based on SATA standard, the flush cache command being a request for nonvolatilization of data stored in the volatile memory.

11. A method of controlling a nonvolatile memory including a at least one first block and a plurality of second blocks, the method comprising:
    writing first data received from a host into the first block in a single level cell mode;
    writing second data received from the host into a third block in a multiple level cell mode, the third block being a block among the second blocks;

calculating a first value in response to a first command received from the host in case where the third block is not full, the first command being a command for committing the first data and the second data, the first value representing an amount of the second data that has been written in the third block or a ratio between the second data that has been written in the third block and an entire capacity of the third block; and moving, into the third block until the third block becomes full, the first data that has been written in the first block in case where the first value is more than a first threshold.

12. The method according to claim 11, further comprising moving, into the third block until the third block becomes full, dummy data or valid data stored in a fourth block, the fourth block being a Garbage Collection source black among the first block and the second blocks in case where the first value is less than the first threshold.

13. The method according to claim 12,
wherein the fourth block includes the valid data and invalid data,
the method further comprising:
writing the valid data into the third block in case where the fourth block is present; and
writing the dummy data into the third block in case where the fourth block is not present.

14. The method according to claim 11, further comprising:
writing the first data into the first block in case where the first block is not full; and
writing the second data into the third block in case where the first block is full.

15. The method according to claim 13, further comprising using a free block among the plurality of second blocks as the first block in case where the first block becomes a bad block.

16. The method according to claim 15, further comprising changing the first threshold based on a number of the plurality of second blocks and a number of times of erasing data of the plurality of second blocks.

17. The method according to claim 16, further comprising decreasing the first threshold in case where the number of the plurality of second blocks is more than a second threshold, and the number of times of erasing data is more than a third threshold.

18. The method according to claim 17, further comprising increasing the first threshold in case where the number of the plurality of second blocks is less than the second threshold, and the number of times of erasing data is less than the third threshold.

19. The method according to claim 13, wherein
the fourth block is a block among the plurality of second blocks.

20. The method according to claim 11, wherein the first command is a flush cache command that is based on SATA standard, the flush cache command being a request for nonvolatilization of data stored in a volatile memory.

* * * * *